United States Patent [19]
Sundby et al.

[11] Patent Number: 5,315,264
[45] Date of Patent: May 24, 1994

[54] RAIL-TO-RAIL OPAMP WITH LARGE SOURCING CURRENT AND SMALL QUIESCENT CURRENT

[75] Inventors: James T. Sundby, Tracy; Alexei N. Shkidt, Newark, both of Calif.

[73] Assignee: Exar Corporation, San Jose, Calif.

[21] Appl. No.: 60,148

[22] Filed: May 10, 1993

[51] Int. Cl.⁵ ............................................. H03F 3/45
[52] U.S. Cl. ................................. 330/253; 330/255; 330/257
[58] Field of Search ............... 330/252, 253, 255, 257

[56] References Cited
U.S. PATENT DOCUMENTS
5,177,450 1/1993 Lee et al. .................... 330/253

*Primary Examiner*—James B. Mullins
*Attorney, Agent, or Firm*—Townsend and Townsend Khourie and Crew

[57] ABSTRACT

A rail-to-rail CMOS operational amplifier with a large source current and small quiescent current. The CMOS opamp includes a folded cascode input structure, a negative slew detector and an output stage that acts as a push-pull output stage during slewing and a Class A output stage during small signal operation. The opamp can drive large capacitive loads (in excess of 0.5 $\mu$F), with the load capacitor providing for the opamp frequency compensation.

11 Claims, 3 Drawing Sheets

RAIL-TO-RAIL OPAMP WITH LARGE SOURCING CURRENT AND SMALL QUIESCENT CURRENT

BACKGROUND OF THE INVENTION

The present invention relates generally to operational amplifier (opamp) circuits, and in particular to rail-to-rail complementary metal-oxide-silicon (CMOS) power opamp circuits.

Rail-to-rail power opamp circuits typically use a push-pull output structure with a PMOS pull-up transistor and an NMOS pull-down transistor. An example of such opamp can be found in "Large Swing Power Amplifier," by Kevin Brehmer and James Weiser, IEEE Journal of Solid State Circuits, Vol. SC-18, No. 6, pp. 624–629 (December 1983). In addition to an input amplifier stage, the Brehmer opamp employs two smaller error amplifiers for the push-pull output stage. The primary disadvantage of this opamp is its complexity and the resulting difficulty involved in stabilizing it. Each one of the error opamps requires its own feedback loop, while at the same time the larger amplifier, which includes the input amplifier and the two smaller error amplifiers, must be stabilized. This also limits the size of the capacitive load the opamp can drive in order to maintain sufficient phase margin. The article provides experimental data for capacitive loads up to 1000 pF only.

An improvement was offered by John Fisher in "A High Performance CMOS Power Amplifier," IEEE Journal of Solid States Circuits, Vol. SC-20, No. 6, pp. 1200–2105 (December 1985). Fisher's opamp combines the previous circuit by Brehmer and Wieser with a circuit that uses source-follower outputs. This makes the overall circuit easier to stabilize. However, the output is no longer rail-to-rail.

There is, therefore, a need for a rail-to-rail power opamp that can drive a large capacitive load, where the load capacitance is the dominant pole.

SUMMARY OF THE INVENTION

The opamp circuit of the present invention includes an output stage with a PMOS pull-up transistor and an NMOS pull-down transistor, to provide a rail-to-rail output, and approximately equal slew rates in both the positive and negative directions. The output stage can also deliver very large source currents while maintaining a small quiescent current.

Furthermore, the opamp circuit of the present invention does not include error amplifiers inside the overall amplifier, and can be stabilized with a capacitive load. The opamp has been designed to drive large capacitive loads of greater than 0.5 $\mu$F.

According to a first embodiment, the opamp circuit of the present invention includes an input circuit with a differential pair first stage that folds a diode-connected pair of load transistors into a second stage. The output of the second stage can therefore swing from rail to rail. This output couples to a negative slew detector circuit input. Several serially connected inverters buffer an output of the negative slew detector circuit and feed it into a gate of a pull-down transistor at the output of the opamp. The detector output turns on the pull-down transistor and allows it to conduct (sink) large amounts of current only when the opamp is slewing in the negative direction.

The rail-to-rail output of the second stage also connects, through a source follower transistor, to a gate terminal of a pull-up transistor at the output of the opamp. The output pull-up transistor size can be made very large to enable the opamp to source large amounts of current. The opamp, however, will maintain a small quiescent current since the pull-down transistor only conducts during negative slewing.

According to a second embodiment, the output stage of the opamp of the present invention further includes a unity gain buffer circuit made up of substrate bipolar transistors. This unit gain buffer connects the output of the second stage to the pull-up transistor in the output stage to increase the bandwidth of the opamp, and help eliminate possible overshoot and ringing caused by the structure of the output stage.

A further understanding of the present invention may be had with reference to the description and diagrams below.

DESCRIPTION OF THE SPECIFIC EMBODIMENTS

Figure 1:
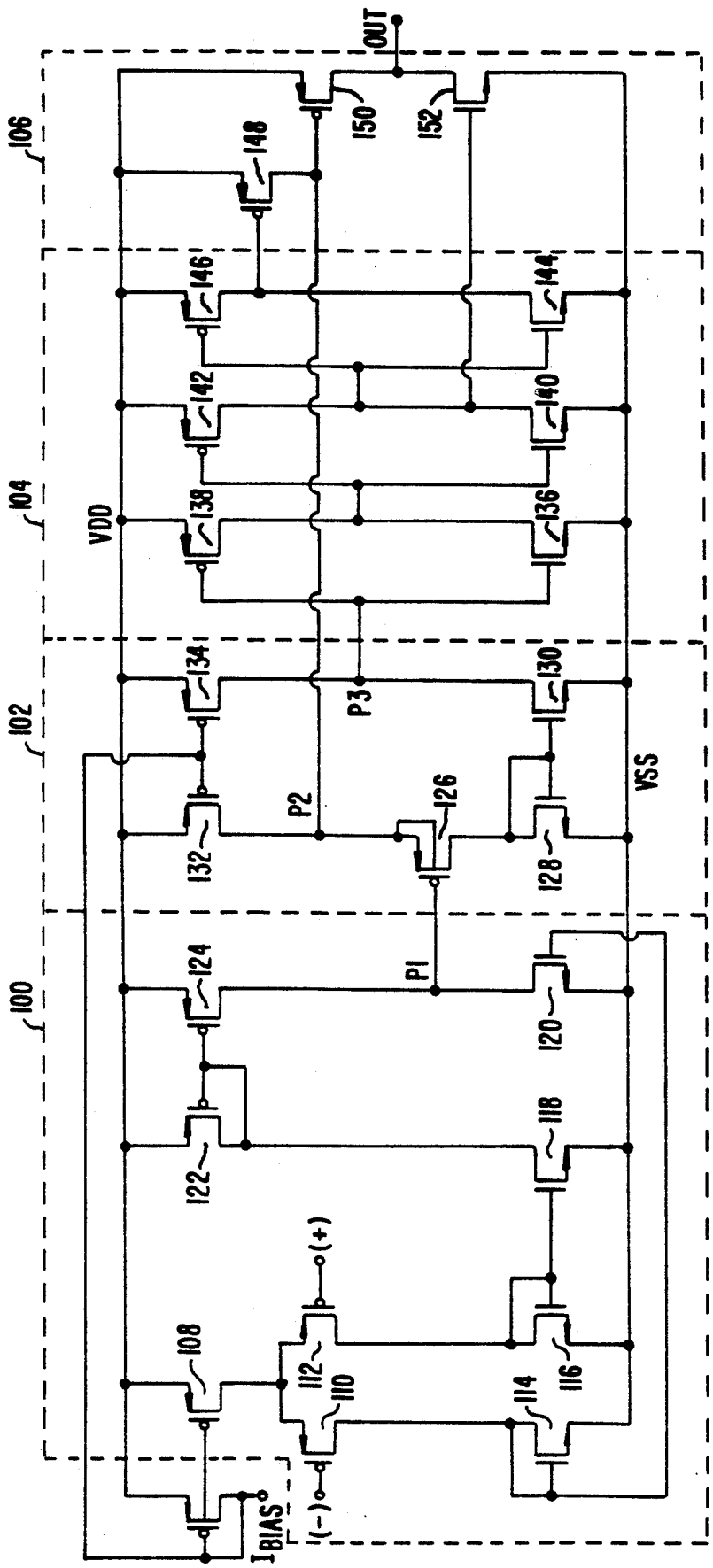
FIG. 1 is a circuit schematic of a first embodiment showing the basic structure of the CMOS opamp of the present invention.

FIG. 1 is a circuit schematic of a first embodiment showing the basic structure of the opamp of the present invention. The opamp has four stages: an input circuit 100, a negative slew detector 102, a buffer circuit 104, and an output stage 106. Input circuit 100 includes a differential pair input stage (transistors 108 through 116) and a folded rail-to-rail second stage (transistors 118 through 124). The output of input circuit 100 connects to an input of negative slew detector 102. Transistors 126 through 134 form negative slew detector 102. The output of negative slew detector 102 connects to an input of buffer circuit 104. Buffer circuit 104 includes three inverters (transistor pairs 136, 138, and 140, 142, and 144, 146) connected in series. Output stage 106 includes a pull-down transistor 152 connecting the opamp output (Vout) to ground, and a pull-up transistor 150 connecting Vout to the power supply (VDD). An output of the second inverter (transistor pair 140, 142) drives the gate of pull-down transistor 152, while the gate of pull-up transistor 150 connects to a source terminal of a source follower transistor 126 in negative slew detector 102.

Transistors PMOS 134 and NMOS 130 are sized such that during small signal operation (i.e. when the opamp is not slewing), NMOS 130 drives more current than PMOS 134. As a result the voltage at the common drain of these transistors (node P3) pulls down to the negative power supply voltage (VSS). Two of buffer 104 inverters condition this voltage and apply it to the gate of output stage 106 pull-down transistor 152. With its gate terminal at VSS, pull-down transistor 152 turns off and conducts no current. Therefore, when not slewing, the opamp output stage 106 operates Class A with PMOS 150 supplying the source current and a feedback network around the opamp supplying the biasing and pull-down current.

In response to a large negative voltage step at the input, the opamp requires large pull-down currents to slew the output in the negative direction. This is when negative slew rate detector 102 becomes active. When a large negative differential voltage appears across the opamp inputs, the output of input circuit 100 (node P1) approaches VDD. Through source-follower PMOS 126 node P2 moves toward VDD also, reducing PMOS 132 drive current. As a result, PMOS 134 drives more current than NMOS 130, causing the voltage at node P3 to rise to VDD. After going through the two buffer inverters, the high voltage at P3 drives the gate of NMOS 152 turning it on. NMOS 152 can now sink large amounts of current, pulling Vout down to VSS. A secondary pull-up transistor PMOS 148 helps PMOS 150 turn off quickly by pulling the gate of PMOS 150 up to VDD. As the output approaches the final value and the opamp approaches small signal operation, the voltage at node P3 moves toward VSS. Pull-down transistor NMOS 152 eventually turns off, returning output stage 106 to a Class A operation. Under quiescent conditions, PMOS 150 delivers only the amount of current required to drive the DC load. Since there is zero sinking current, this opamp consumes very little current when there is no load from Vout to VSS.

When the opamp is required to slew in the positive direction, the voltage at node P1, and therefore P2, pulls down toward VSS. With a low voltage at its gate, PMOS 150 turns on pulling Vout up close to VDD. Pull-down transistor NMOS 152 remains turned off during positive slewing as well as throughout the opamp's small signal operation. Source-follower transistor PMOS 126 isolates the highly capacitive P2 node at the gate of PMOS 150 from the high impedance P1 node at the output of the input circuit 100. This moves the pole created by this high impedance node out to much higher frequencies to improve the small signal performance of the opamp. Therefore, the size of transistor PMOS 150 can be made very large enabling the opamp to deliver very large currents.

Therefore, the opamp of the present invention can source large currents even when the output is at the top rail, while maintaining a small quiescent current. The opamp can deliver currents in excess of 50 mA when its output is only 0.4 volts away from the positive supply rail, and can drive capacitive loads of greater than 0.5 µF. Furthermore, the output structure of the opamp allows it to drive this load with approximately equal rise and fall times.

Figure 2:
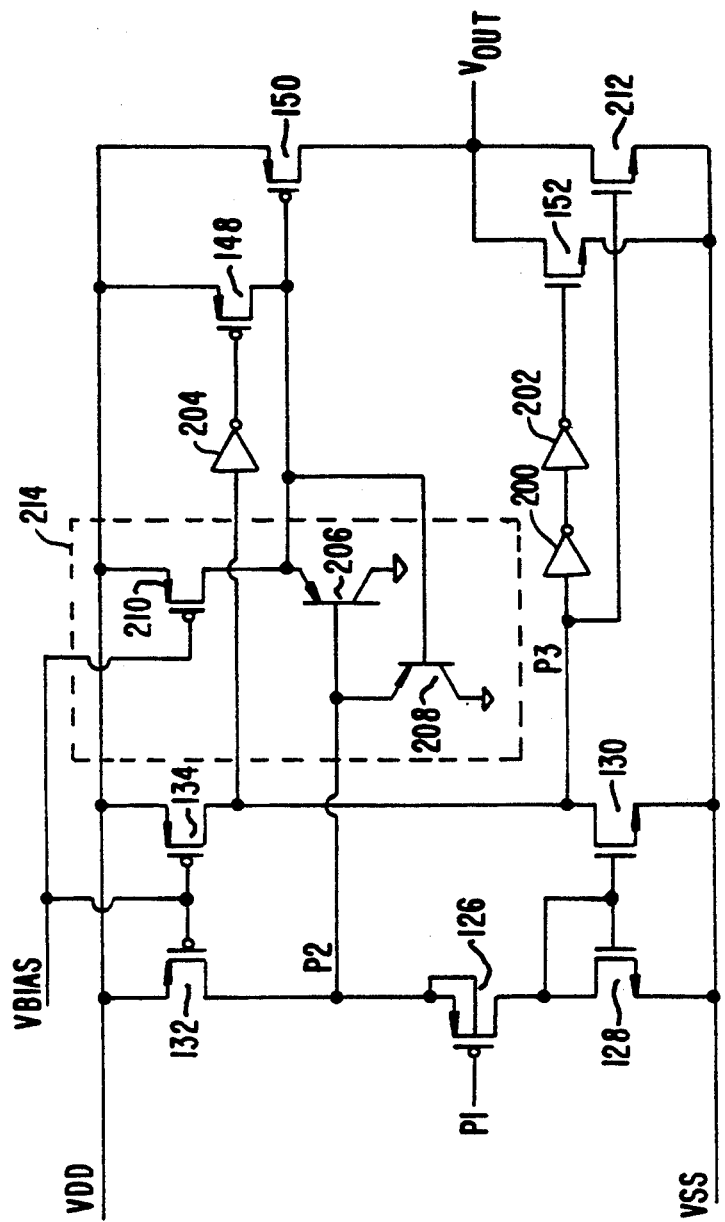
FIG. 2 is a circuit schematic of an enhanced output stage for a second embodiment of the CMOS opamp of the present invention.

FIG. 2 is a circuit schematic of an enhanced output stage for a second embodiment of the opamp of the present invention. Negative slew detector 102 and buffer circuit 104 remain unchanged, except that the three inverters of the buffer circuit are symbolically represented as inverters 200, 202 and 204, representing transistor pairs 136, 138 and 140, 142 and 144, 146, respectively. Also, the input of inverter 204 is no longer connected to the output of inverter 202. Instead, the input of inverter 204 is driven by the voltage at note P3 directly, without affecting the logical operation of the circuit.

A unity gain buffer circuit 214 has been added to improve several aspects of the opamp small signal operation. Also a second pull-down NMOS transistor 212 is added for smoother slewing at the output in the negative direction.

Unity gain buffer 214 includes an emitter-follower substrate bipolar (PNP) transistor 206, a clamp substrate bipolar (PNP) transistor 208, and a current source PMOS transistor 210. Emitter-follower substrate PNP transistor 206 performs a similar function as that of source-follower PMOS 126. Because of the large size of output transistor 150, the amount of capacitance at the node connecting to its gate can be significant. To avoid degradation of the small signal performance of the opamp by the capacitive loading at this node, emitter-follower 206 was added to provide buffering. This will move the pole due to PMOS 150 gate capacitance to a higher frequency, improving opamp stability and settling time. PMOS 210 is a current source transistor that provides the biasing for emitter-follower 206.

Clamp PNP transistor 208 helps eliminate overshoot and ringing when node P2 slews in the positive direction. Because the gate of PMOS 150 has more capacitance than node P2, the voltage at node P2 will slew positive much faster than the gate of PMOS 150. If the voltage at P2 rises substantially higher than the gate voltage of PMOS 150, recovery will be delayed, causing overshoot and ringing on the opamp output. However, the base-emitter diode of bipolar transistor PNP 208 will clamp the voltage at P2 at one diode drop above the gate voltage of PMOS 150. This will decrease any overshoot and reduce the possibility of oscillation.

The addition of a second pull-down transistor NMOS 212 provides for a smoother slewing at the output in the negative direction. Skewing the sizes of the transistors in inverter 200 (i.e. transistors 136 and 138) will create a difference in the turn-on voltage of NMOS 212 and NMOS 152. This will cause NMOS 152 to turn off before NMOS 212 as Vout approaches its final value during negative slewing. As a result, the total slewing current decreases gradually as the opamp approaches small signal operation. Once the opamp enters small signal operation, the gate voltage of NMOS 152 and NMOS 212 are at VSS, turning them off. At this point the output stage returns to a Class A operation.

Figure 3:
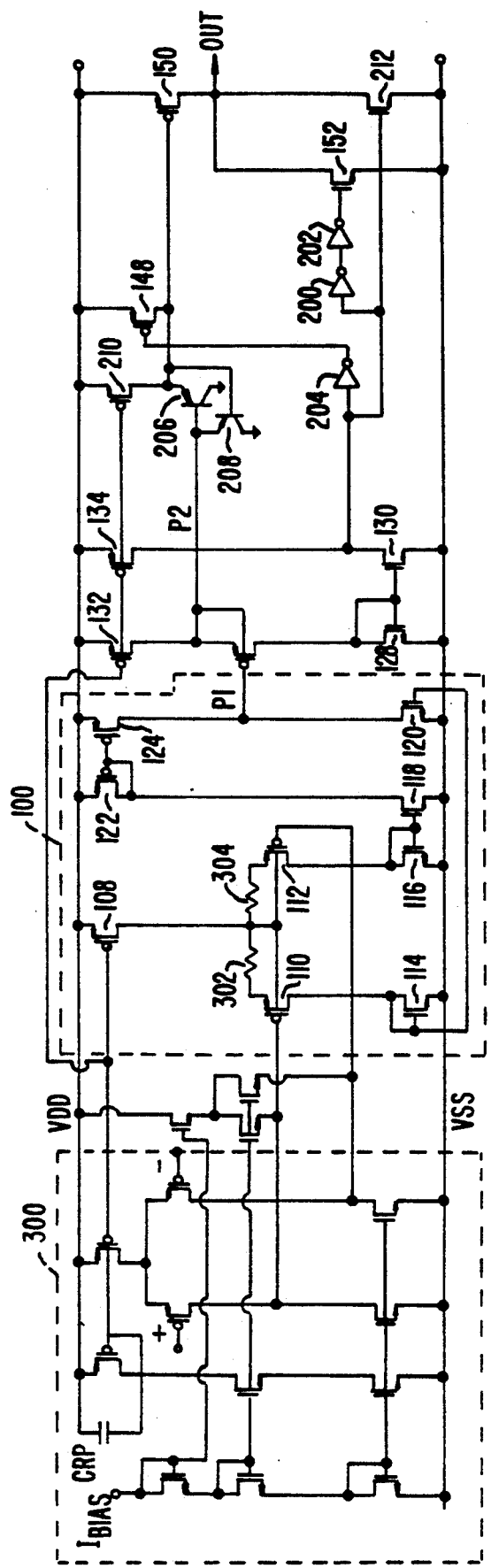
FIG. 3 is a circuit schematic of the complete opamp according to a third embodiment of the present invention.

Referring to FIG. 3, there is shown a circuit schematic of a third embodiment of the complete opamp of the present invention. This embodiment includes the enhancements described in the second embodiment as well as additional circuitry to optimize the overall opamp performance.

In the opamp circuit of FIG. 3, the differential pair input stage of input circuit 100 includes source degeneration resistors 302 and 304. This will help temperature compensate the gain of this stage. The effective transconductance of input transistors 110 and 112 decreases with temperature, lowering the gain of the input stage. By including negative temperature coefficient, high sheet-rho polysilicon resistors 302 and 304 at the source terminals of input transistors 110 and 112, the effective transconductance and therefore gain remains more constant over a wider temperature range.

The opamp of FIG. 3 also includes a wide-band preamplifier stage 300 to increase the overall gain of the opamp. In certain applications very low small signal output resistance may be required. However, area constraints may not allow for further increases in the size of output transistor PMOS 150. In this case, to achieve the required small signal output resistance, it may be necessary to increase the gain of the input stage. However, the gain of input circuit 100 is inversely proportional to the square root of the tail current through PMOS 108 and directly proportional to the square root of the sizes of input transistors 110 and 112. Decreasing the current is not desirable since this will result in moving the pole at node P1 to lower frequencies, degrading the small signal performance of the opamp. On the other hand, an increase in the gain by a factor of three requires an increase in the sizes of input transistors 110 and 112 by a factor of nine. This is also undesirable from an area standpoint as well as increased capacitive loading at the inputs. Therefore, to obtain a given DC output resistance while maintaining overall amplifier stability and size, a wide-band preamplifier stage 300 is added. Preamplifier stage 300 provides the required gain factor, and is designed with sufficiently high bandwidth to have negligible affect on the phase margin of the overall amplifier.

In conclusion, the present invention offers a rail-to-rail power opamp that can be frequency compensated with a capacitive load. The opamp of the present invention can deliver large source currents while maintaining a small quiescent current. Furthermore, the opamp output structure provides for approximately equal slew rates in both the positive and negative directions. While the above is a complete description of the preferred embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A CMOS operational amplifier coupled between a first and a second power supply rail, and having differential inputs and an output, comprising:
    an input circuit having a differential pair input stage coupled to the operational amplifier differential inputs, and a folded rail-to-rail second stage with an output;
    a negative slew detector having an input and an output, with said input coupled to said input circuit output;
    a buffer circuit having an input coupled to said negative slew detector output; and
    an output stage coupled to said buffer circuit and said negative slew detector, with an output coupled to the operational amplifier output.

2. The CMOS operational amplifier of claim 1 wherein said negative slew detector comprises:
    a source follower transistor having a gate terminal coupled to said input circuit output;
    a current source load transistor coupling a source terminal of said source follower transistor to the first power supply rail;
    a diode-connected transistor coupling a drain terminal of said source follower transistor to the second power supply rail;
    a current mirroring transistor having a gate terminal coupled to a gate and drain of said diode-connected transistor; and
    a load transistor having a gate terminal coupled to a gate terminal of said current source load transistor, and coupling said detector output at a drain of said current mirroring transistor to the first power supply rail;
    wherein, during negative slewing, a signal at said source follower transistor gate terminal moves close to the first power supply rail turning off said current source load transistor, and pulling said detector output close to the first power supply rail.

3. The CMOS operational amplifier of claim 2 wherein said output stage comprises:
    a first pull-up transistor having a gate terminal coupled to said source follower transistor source terminal, and a drain terminal coupled to the operational amplifier output; and
    a pull-down transistor having a gate terminal coupled to a non-inverting output of said buffer circuit, and a drain terminal coupled to the operational amplifier output.

4. The CMOS operational amplifier of claim 3 wherein said buffer circuit comprises a plurality of inverters coupled in series.

5. The CMOS operational amplifier of claim 4 wherein said output stage further comprises a second pull-up transistor having a drain terminal coupled to said first pull-up transistor gate terminal, and a gate terminal coupled to an inverting output of said buffer circuit.

6. The CMOS operational amplifier of claim 3 further comprising a unity gain buffer circuit coupling said source terminal of said source follower transistor to said gate terminal of said first pull-up transistor.

7. The CMOS operational amplifier of claim 6 wherein said unity gain buffer circuit comprises:
    an emitter follower bipolar transistor having an emitter terminal coupled to said gate terminal of said first pull-up transistor, a base terminal coupled to said source follower transistor source terminal, and a collector terminal coupled to the second power supply rail;
    a clamp bipolar transistor having an emitter terminal coupled to said source follower transistor source terminal, a base terminal coupled to said emitter follower emitter terminal, and a collector terminal coupled to said second power supply rail; and
    a current source load transistor coupling said emitter follower emitter terminal to the first power supply rail.

8. The CMOS operational amplifier of claim 1 further comprising a preamplifier stage coupled to said input circuit inputs to increase an overall gain of the CMOS operational amplifier.

9. The CMOS operational amplifier of claim 1 wherein said differential pair input stage further comprises source degeneration resistors.

10. A CMOS operational amplifier coupled between a first and a second power supply rail, and having differential inputs and an output, comprising:
    an input circuit including:
    a differential pair input stage having a pair of input transistors coupled to the operational amplifier differential inputs, respectively, and a pair of diode-connected load transistors,
    a folded rail-to-rail second stage having a pair of current mirroring transistors coupled to said diode-connected load transistors, respectively, and a pair of current mirroring pull-up transistors;
    a negative slew detector including:
    a source follower transistor having a gate terminal coupled to an output of said input circuit,
    a current source load transistor coupling a source terminal of said source follower transistor to the first power supply rail,
    a diode-connected transistor coupling a drain terminal of said source follower transistor to the second power supply rail, a current mirroring transistor having a gate terminal coupled to a gate and drain of said diode-connected transistor, and a load transistor having a gate terminal coupled to a gate terminal of said current source load transistor, and coupling said detector output at a drain of said current mirroring transistor to the first power supply rail;

a buffer circuit having an input coupled to said negative slew detector output and coupled to a plurality of inverters, with said plurality of inverters coupled in series, said buffer circuit having a pair of inverting and non-inverting outputs; and an output stage including:

a first pull-up transistor having a gate terminal coupled to said source follower transistor source terminal, and a drain terminal coupled to the operational amplifier output, and a pull-down transistor having a gate terminal coupled to said buffer circuit non-inverting output, and a drain terminal coupled to the operational amplifier output.

11. The CMOS operational amplifier of claim 10 wherein said output stage further comprises a second pull-up transistor having a gate terminal coupled to said buffer circuit inverting output, and a drain terminal coupled to said first pull-up transistor gate terminal.

* * * * *